United States Patent
Hubbard et al.

(10) Patent No.: US 8,991,115 B2
(45) Date of Patent: Mar. 31, 2015

(54) SOLAR PANEL ASSEMBLY WITH MOVABLE BARRIERS

(71) Applicant: Firestone Building Products Co, LLC, Indianapolis, IN (US)

(72) Inventors: Michael J. Hubbard, Goshen, IN (US); Timothy J. McQuillen, Westfield, IN (US)

(73) Assignee: Firestone Building Products Co., LLC, Indianapolis, IN (US)

( * ) Notice: Subject to any disclaimer, the term of this patent is extended or adjusted under 35 U.S.C. 154(b) by 0 days.

(21) Appl. No.: 13/767,324

(22) Filed: Feb. 14, 2013

(65) Prior Publication Data

US 2013/0205692 A1 Aug. 15, 2013

Related U.S. Application Data

(60) Provisional application No. 61/645,717, filed on May 11, 2012, provisional application No. 61/598,561, filed on Feb. 14, 2012.

(51) Int. Cl.
*E04D 13/18* (2014.01)
*A62C 2/24* (2006.01)
(Continued)

(52) U.S. Cl.
CPC .............. *H01L 31/0422* (2013.01); *A62C 2/24* (2013.01); *E04B 1/945* (2013.01); *F24J 2/4621* (2013.01); *F24J 2/5233* (2013.01); *Y02B 10/20* (2013.01); *Y02B 10/12* (2013.01); *Y02E 10/47* (2013.01)
USPC .................. 52/173.3; 52/656.1; 52/90.2; 52/1

(58) Field of Classification Search
CPC ......... F24J 2/5245; F24J 2/5243; F24J 2/525; F24J 5/523; F24J 2/5232; F24J 2/5233; H01L 31/0422; Y02E 10/50

USPC .................. 52/1, 36.5, 90.1, 90.2, 173.3, 262, 52/302.3, 656.1, 656.3
See application file for complete search history.

(56) References Cited

U.S. PATENT DOCUMENTS 1,429,587 A * 9/1922 Harris .............................. 72/461
3,467,163 A * 9/1969 Vassaux ............................ 160/1
(Continued)

FOREIGN PATENT DOCUMENTS

JP    2003 268942 A    9/2003
JP      2003268942 A *  9/2003  .............. E04D 13/18

OTHER PUBLICATIONS

USPTO STIC translation of previously cited reference Iwasaki JP 2003268942 A (2003268942JPA.TRANS.pdf)(52 pages).*
(Continued)

*Primary Examiner* — Charles A Fox
*Assistant Examiner* — Joseph J Sadlon
(74) *Attorney, Agent, or Firm* — Jason A. Houser; Arthur M. Reginelli

(57) ABSTRACT

A solar panel assembly including a solar panel spaced from a surface to create a gap and a barrier movable between an open position and a closed position, the barrier being adapted to inhibit airflow through said gap below said solar panel when in the closed position. The assembly may further include a rack supporting the solar panel and resting on the surface. The barrier may be adapted to move from the open position to the closed position upon detection of conditions indicative of a fire. In this way air flow below the solar panel is permitted during normal operation of the solar panel assembly but is inhibited upon detection of a fire.

12 Claims, 10 Drawing Sheets

(51) Int. Cl.
  *E04B 1/94* (2006.01)
  *F24J 2/46* (2006.01)
  *F24J 2/52* (2006.01)
  *H01L 31/042* (2014.01)

(56) References Cited

U.S. PATENT DOCUMENTS

| | | | |
|---|---|---|---|
| 3,884,009 A * | 5/1975 | Frohlich et al. | 52/745.06 |
| 4,100,931 A | 7/1978 | Pantland et al. | |
| 4,421,943 A * | 12/1983 | Withjack | 136/246 |
| 4,763,711 A * | 8/1988 | Hart et al. | 160/1 |
| 5,373,839 A * | 12/1994 | Hoang | 126/621 |
| 6,809,251 B2 * | 10/2004 | Dinwoodie | 136/251 |
| D519,444 S * | 4/2006 | Mascolo | D13/102 |
| 8,505,248 B1 * | 8/2013 | Leong et al. | 52/173.3 |
| 8,748,732 B2 * | 6/2014 | Luo et al. | 136/246 |
| 2007/0017738 A1 | 1/2007 | Truss | |
| 2008/0141486 A1 | 6/2008 | Goates | |
| 2008/0264405 A1 | 10/2008 | Van Becelaere | |
| 2010/0269889 A1 * | 10/2010 | Reinhold et al. | 136/251 |
| 2012/0124923 A1 * | 5/2012 | Goodman et al. | 52/232 |
| 2013/0112248 A1 * | 5/2013 | McPheeters | 136/251 |

OTHER PUBLICATIONS

International Search Report for International Appl. No. PCT/US2013/026121; dated Jul. 19, 2013; 10 pages.

* cited by examiner

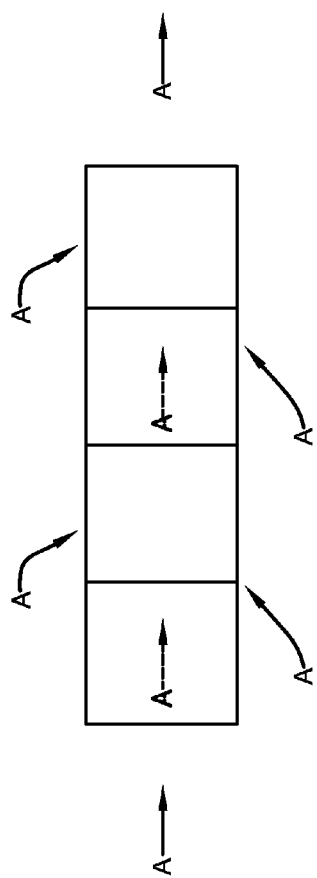
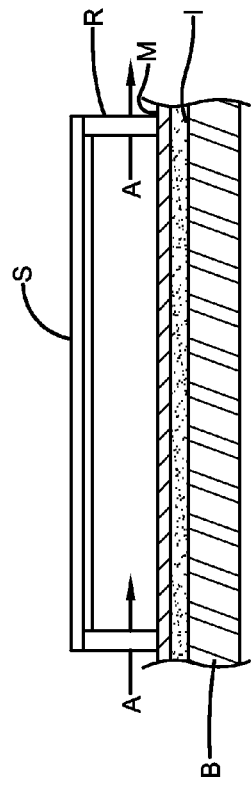

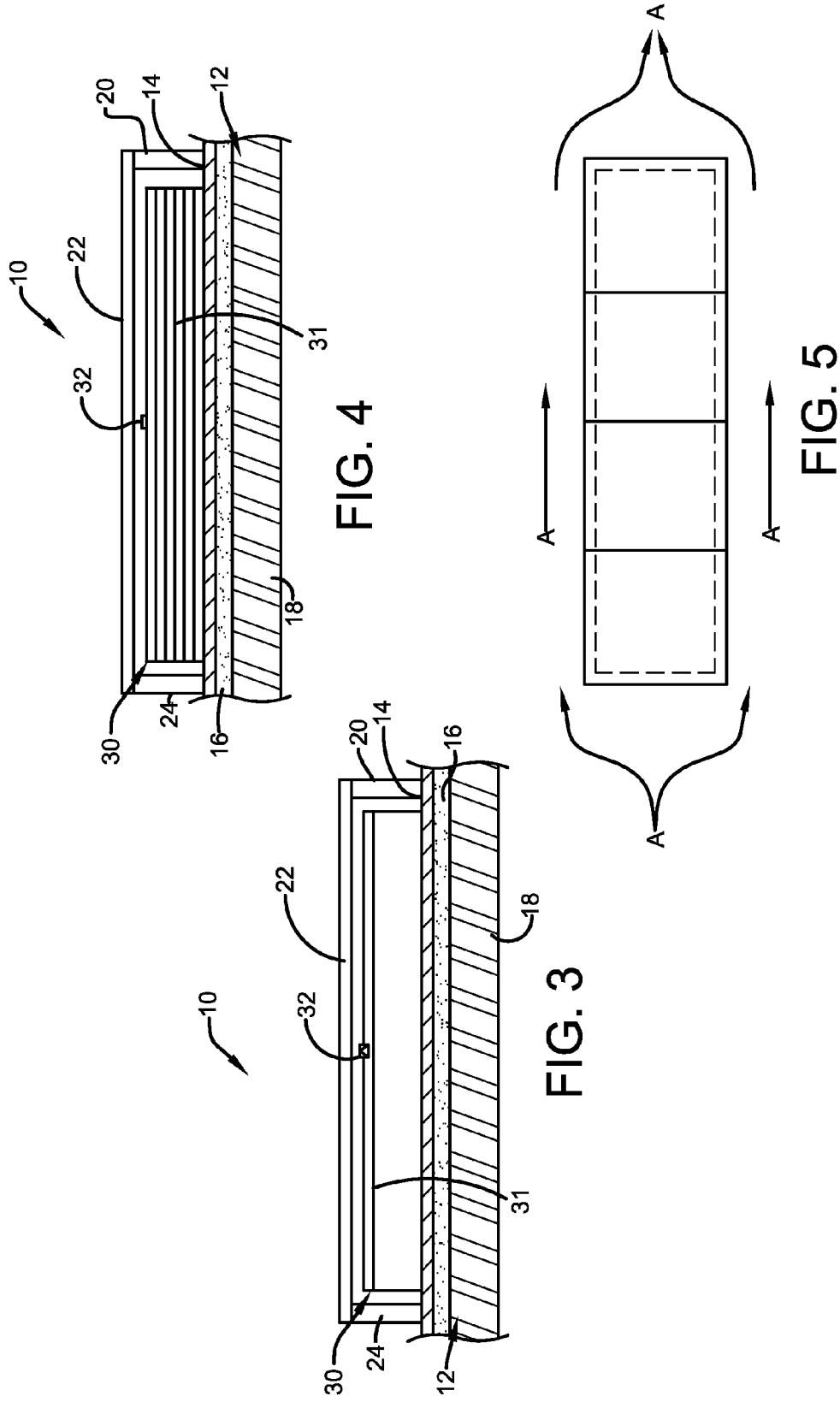

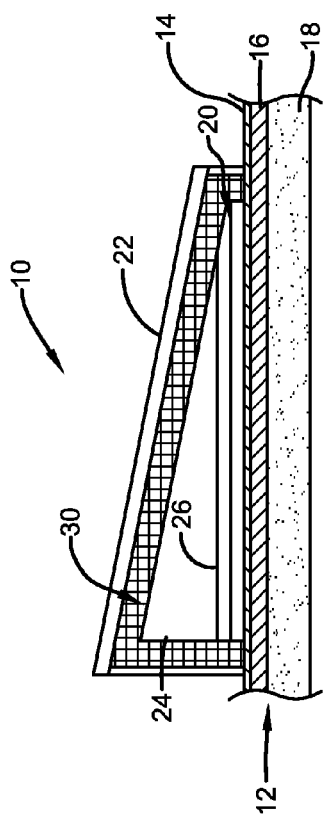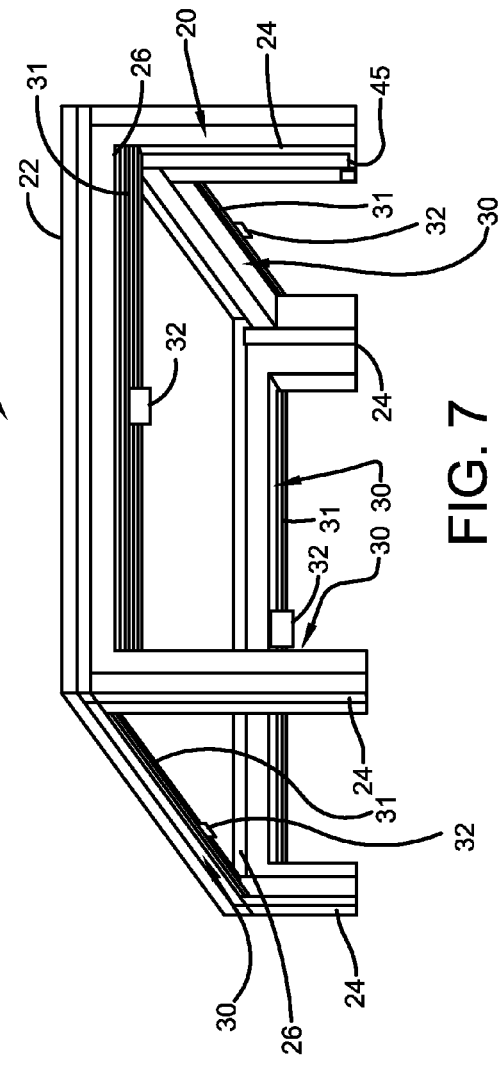

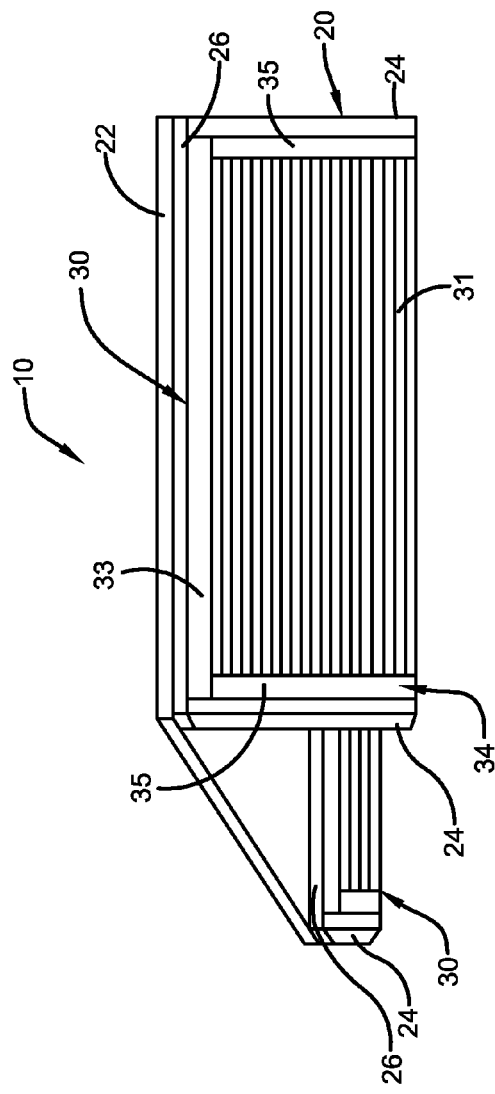
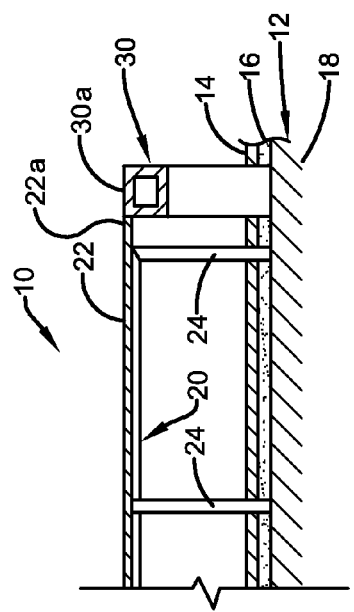

SOLAR PANEL ASSEMBLY WITH MOVABLE BARRIERS

This application claims the benefit of U.S. Provisional Application Ser. Nos. 61/598,561, filed on Feb. 14, 2012 and 61/654,717, filed on May 11, 2012, which are incorporated herein by reference.

FIELD OF THE INVENTION

Embodiments of the present invention relate to solar panel assemblies that include one or more fire barrier assemblies. The fire barrier assemblies inhibit airflow beneath the solar panels during a fire event and thereby prevent rapid spread of fire upon the roof.

BACKGROUND OF THE INVENTION

Solar panels are often installed over roofing assemblies due to the favorable conditions on the roof surface for collecting solar energy and the otherwise unused square footage available on the roof. These solar panel assemblies often include a support structure, which may be referred to as a rack, and a solar panel array including one or more solar panels positioned on and supported by the rack.

Referring to FIGS. 1 and 2, a conventional solar panel assembly is shown. A solar panel S is secured to a rack R, which is itself secured to a roofing assembly. In the case of flat roofs, the roofing assembly may include a roofing membrane M, an optional insulation layer I, and a roof substrate B. Rack R creates a space between solar panel S and the roofing assembly that allows airflow A beneath the solar panel. This airflow is advantageous under normal operating conditions because it generates a cooling affect on the solar panel, which results in increased efficiency of the solar panel.

While the airflow beneath the solar panels allowed by the rack system is beneficial in most instances, it does have disadvantages. In certain circumstances, fire and fire spread on rooftops may be amplified due to the airflow patterns created by the solar panel assembly. This is particularly problematic because many roofing systems must meet stringent fire code regulations. As a result, building owners, architects, and engineers may be forced to utilize less efficient solar panel assemblies in certain circumstances in order to meet fire code regulations, or they may choose to forego the solar panel assembly altogether due to safety concerns.

Thus, there is a need for an improved solar panel assembly that alleviates one or more of the deficiencies of the prior art discussed above.

SUMMARY OF THE INVENTION

One or more embodiments of the present invention provide a solar panel assembly comprising: a solar panel; and a barrier movable between an open position and a closed position, the barrier being adapted to inhibit airflow below said solar panel when in the closed position.

One or more embodiments of the present invention also provides a solar panel assembly comprising: a support rack positioned on a surface, the support rack having a front side, a back side, a left side, and a right side; a plurality of solar panels positioned above said support rack and spaced from said surface to create a gap, the plurality of solar panels forming a solar array; and at least one barrier positioned below said solar array on each of said front, back, left and right sides of said support rack, wherein said barrier assemblies are each movable between an open position and a closed position, the barrier assemblies being adapted to inhibit airflow through said gap below said solar panel array when in the closed position.

One or more embodiments of the present invention also provides a roofing assembly comprising: a roofing membrane positioned over a roof surface; a support rack positioned over said roof surface; a solar panel positioned above said support rack and spaced from said roofing membrane to create a gap; and a barrier positioned below said solar panel and movable between an open position and a closed position, the barrier being adapted to inhibit airflow through said gap between said solar panel and said membrane when in the closed position.

One or more embodiments of the present invention also provides a roofing assembly comprising: a rack adapted to support at least one solar panel; and a barrier movable between an open position and a closed position and adapted to inhibit air flow when in the closed position.

One or more embodiments of the present invention also provides a fire barrier assembly comprising a movable barrier and at least one element connected to the movable barrier, where the element is adapted for mounting the movable barrier to a solar panel support rack.

One or more embodiments of the present invention also provides a solar panel assembly comprising a solar panel and a support rack adapted to support said solar panel at a height over a roof deck; where the support rack includes one or more elements that are designed to fail upon exposure to heat generated by fire and thereby allow the solar panel to fall to the roof deck.

BRIEF DESCRIPTION OF THE DRAWINGS

FIG. 1 is a schematic view of a prior art solar panel assembly and the airflow under and around the system according to the methods of the present invention;

FIG. 2 is a side view of a prior art solar panel assembly showing the airflow pattern beneath the solar panel;

FIG. 3 is a side view of a solar panel assembly according to the concepts of the present invention including a barrier;

FIG. 4 is a side view of a solar panel assembly according to the concepts of the present invention where the barrier is lowered into a closed position;

FIG. 5 is a schematic view of a solar panel assembly according to the concepts of the present invention showing airflow patterns created when the barrier assemblies are in a closed position;

FIG. 6 is a side view of another embodiment of a solar panel assembly having angled solar panels and including barrier assemblies according to the concepts of the present invention;

FIG. 7 is a perspective view of the solar panel assembly of FIG. 6 with the barrier assemblies in an open position;

FIG. 8 is a perspective view of the solar panel assembly of FIG. 6 with the barrier assemblies in a closed position;

FIG. 11 is a fragmentary section view of another embodiment of a solar panel assembly having barrier assemblies attached to the outer peripheral edge of the solar panels.

DETAILED DESCRIPTION OF THE ILLUSTRATIVE EMBODIMENTS

Figure 9:
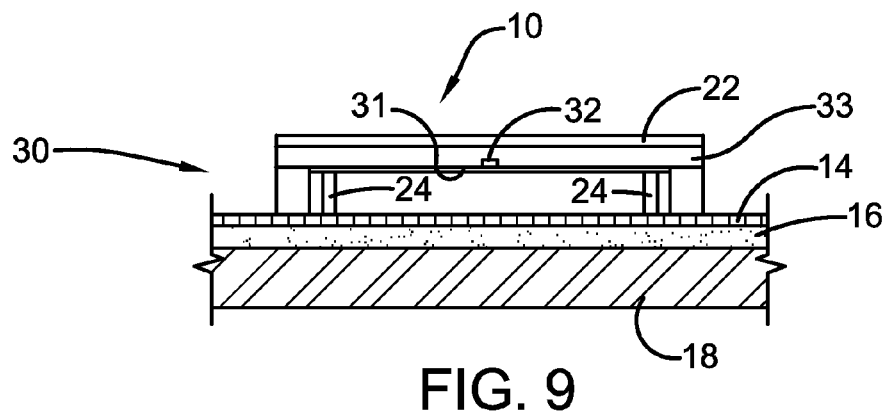
FIG. 9 is a side view of another embodiment of a solar panel assembly having barrier assemblies attached to the solar panels, with the barrier in an open position.

Embodiments of the invention are based, at least in part, on the discovery of a solar panel assembly including one or more fire barrier assemblies. Advantageously, these fire barrier assemblies allow air flow under or beneath the solar panels during normal operating conditions and inhibit air flow under the solar panels during a fire event to thereby improve the fire performance of the roofing system by inhibiting airflow patterns that have a tendency to accelerate flame spread. In one or more embodiments, the barrier assemblies may include a barrier that is movable between an open position and a closed position. In particular embodiments, the barrier assembly can advantageously be directly incorporated or integrated into the solar panel assembly or, in other embodiments, a barrier assembly can advantageously be adapted so that the barrier assembly can be combined with a solar assembly as an accessory or after-market assembly.

Referring now to FIGS. 3 and 4, a solar panel assembly is shown, which is generally indicated by the numeral 10. In one or more embodiments, solar panel assembly 10 may be positioned over a roofing assembly 12. Roofing assembly 12, which may also be referred to as roofing system 12, may be any type of roofing assembly known to those skilled in the art. For example, solar panel assembly 10 may be positioned over a roofing assembly including asphalt, modified bitumen, shingles, or other suitable roofing materials known in the art. In one or more embodiments, the roofing assembly may include a roofing membrane 14 that is impervious to moisture and an optional insulation layer 16 below the roofing membrane; membrane 14 and optional insulation 16 may be positioned over a roof substrate 18 that supports the roofing membrane and the optional insulation layer.

In certain embodiments, roofing membrane 14 of roofing assembly 12 may be formed from a polymeric material. In one or more embodiments, the roofing membrane may be formed from a thermosetting material, such as, for example, EPDM. In other embodiments, roofing membrane 14 may be formed from a thermoplastic material, such as, for example, TPO. In certain embodiments, the roofing membrane may be formed from a PVC material. In other embodiments, the roofing membrane may be formed from chlorosulfonated polyethylene (CSPE). In certain embodiments, roofing membrane 14 may include any known fillers and/or additives. In one or more embodiments, roofing membrane 14 may include fire retardants to improve the fire resistance of roofing assembly 12.

In one or more embodiments, the solar panel assembly 10 may include a rack 20, which may also be referred to as support structure 20, that supports one or more solar panels 22. In certain embodiments, rack 20 may include a plurality of vertical legs 24 extending between the solar panel and the roofing assembly, and one or more optional braces 26 extending horizontally between the legs (see FIG. 6). Rack 20 may be provided in a variety of configurations and designs, as will be appreciated by those skilled in the art, any of which may be utilized in practice of the present invention.

For example, in certain embodiments, rack 20 may be adapted to support a single row of solar panels 22, and in other embodiments rack 20 may be adapted to support a plurality of rows of solar panels 22. In addition, rack 20 may be adapted to support solar panels 22 in a generally horizontal orientation, as shown in FIGS. 1-5, or alternatively may be adapted to support solar panels 22 at an acute angle relative to a horizontal surface, as shown in FIGS. 6-8.

Rack 20 may be secured on the roof surface by any method or mechanism known to those skilled in the art. In one or more embodiments, rack 20 may be secured over roofing membrane 14 by ballasts. In other embodiments, rack 20 may be attached directly to roof substrate 18 with mechanical fasteners or other known attachment mechanisms. In these embodiments, insulation layer 16 and roofing membrane 14 may be installed around rack 20 following attachment of the rack to roof substrate 18. In one or more embodiments, rack 20 may be secured over roofing membrane 14 and/or the insulation layer by mechanical fasteners that pass through membrane 14, and at least partially through insulation layer 16.

Solar panels 22, which may also be referred to as photovoltaic modules 22, of solar panel assembly 10 may be any type of solar panels known to those skilled in the art. Solar panels 22 may each include an arrangement of a plurality of photovoltaic cells. In certain embodiments, solar panels 22 may include conventional components, such as, for example, electrical connections, diodes, concentrators, and a frame or other support structure. Practice of the present invention is not necessarily limited by the type of solar panels 22 used.

In one or more embodiments, a barrier assembly 30 may be provided at at least one edge of solar panel 22. In certain embodiments, a plurality of barrier assemblies may be provided around the peripheral edge of rack 20. In one or more embodiments, barrier assemblies 30 are positioned beneath or adjacent to solar panel 22. A single barrier assembly 30 may be provided on each of the four sides of solar panel assembly 10, or a plurality of adjacent barrier assemblies 30 may be provided on one or more of the four sides of rack 20. For example, FIG. 7 shows solar assembly 10 having barrier assemblies 30 positioned on each of four sides of the assembly.

In certain embodiments, barrier assemblies 30 may be incorporated into rack 20 and may serve as the vertical legs to support solar panels 22. In other embodiments, it is contemplated that barrier assemblies 30 may support the solar panels 22 without a need for a rack 20. In one or more embodiments, and as shown for example, in FIG. 6, one or more of barrier assemblies 30 may be adapted to accommodate angled solar panels 22.

In one or more embodiments, barrier assemblies 30 may be provided as an integrated part of a new solar racking system 20. In certain embodiments, barrier assemblies 30 may be provided from a manufacturer already secured to rack 20. In other embodiments, barrier assembly 30 may be provided from a manufacturer adapted to be secured to rack 20. In one or more embodiments, barrier assemblies 30 may be added to an existing rack 20 already installed on a roof surface as an add-on or after-market accessory.

Figure 10:
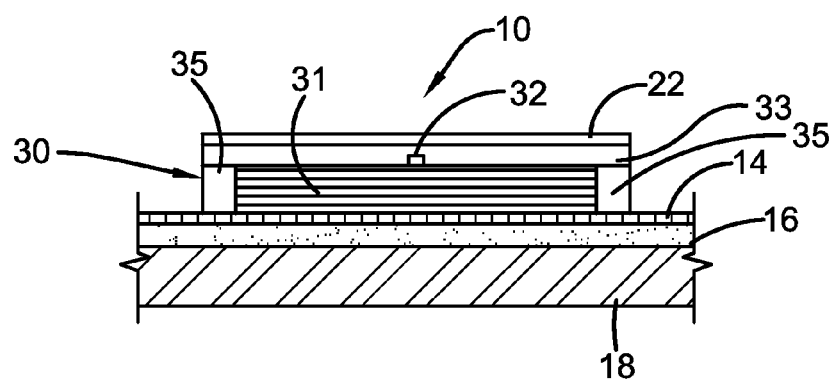
FIG. 10 is a side view of the solar panel assembly of FIG. 9 with the barrier in a closed position.

In one or more embodiments, as shown in FIGS. 3-4 and 6-8, barrier assemblies 30 may be positioned between vertical legs 24 of rack 20, or may be otherwise secured to rack 20. In other embodiments, as shown in FIGS. 9-11, barrier assemblies 30 may be secured to solar panels 22 at a location adjacent to the peripheral edges 23 of panels 22. In certain embodiments, barrier assemblies 30 may be secured to an underside of solar panels 22, as shown in FIGS. 9 and 10. In other embodiments, as shown in FIG. 11, barrier assemblies 30 may be secured to an outer peripheral edge of solar panel 22, and may therefore have a top surface 30a positioned generally flush with a top surface 22a of solar panel 22. In certain embodiments, a bottom 30b of barrier assemblies 30 may be in contact with roof substrate 18, as shown in FIG. 11. In other embodiments, the bottom of barrier assemblies 30 may be in contact with roofing system 12, such as, for example, the membrane 14, as shown in FIGS. 3 and 4.

In one or more embodiments, barrier assemblies 30 each include a barrier 31, which may also be referred to as moveable barrier 31 or door 31, that is movable between an open position and a closed position. In one or more embodiments, barrier assemblies 30, including barriers 31, may have fire resistant characteristics. In the same or other embodiments, barrier assemblies 30 may be adapted to inhibit the flow of air therethrough when barrier 31 is closed. In one or more embodiments, movable barrier 31 may be formed from a metal, such as, for example, steel. In other embodiments, movable barrier 31 may be formed from other fire and/or smoke resistant materials.

In one or more embodiments, each of movable barriers 31 of barrier assemblies 30 may be movable between an open first position, as shown in FIG. 3, and a generally closed second position, as shown in FIG. 4. Airflow beneath solar panel 22 may be permitted when movable barrier 31 is in the open position, and airflow beneath solar panel 22 may be inhibited when movable barrier 31 is in the closed position. As will be appreciated by those skilled in the art, closing of barrier assemblies 30 may inhibit the airflow patterns that accelerate or amplify a fire on a rooftop, and thereby improve the fire resistance of the roofing assembly. While a barrier 31 that is movable vertically is shown, it is also contemplated that the barrier may be adapted to move horizontally between the open and closed positions.

In certain embodiments, where barrier assemblies 30 are in contact with roof substrate 18, movable barrier 31 may be adapted to continue moving downward toward the roof substrate if roofing membrane 14 and insulation layer 16 melt or are otherwise destroyed by a fire. In this way, barrier assembly 30 may continue to inhibit an appreciable airflow beneath solar panels 22 even where membrane 14 and insulation layer 16 beneath barrier 30 is compromised. In other embodiments, where barrier assemblies 30 are positioned over membrane 14 or insulation layer 16, and are not in contact with roof substrate 18, the entire barrier assembly 30 may sink into the compromised roofing membrane 14 and/or insulation layer 16 so that an appreciable airflow beneath solar panels 22 is inhibited in the event of damage to the roofing assembly.

Movable barrier 31 may be provided in any configuration that is movable between an open first position, which permits airflow beneath solar panels 22, and a closed second position, which inhibits airflow beneath solar panels 22. In one or more embodiments, movable barrier 31 may be provided in the form of a fire damper as is often found in heating and cooling ducts. These fire dampers are available in a variety of designs and configurations, any of which may be adapted for use in practice of the present invention.

Figure 12:
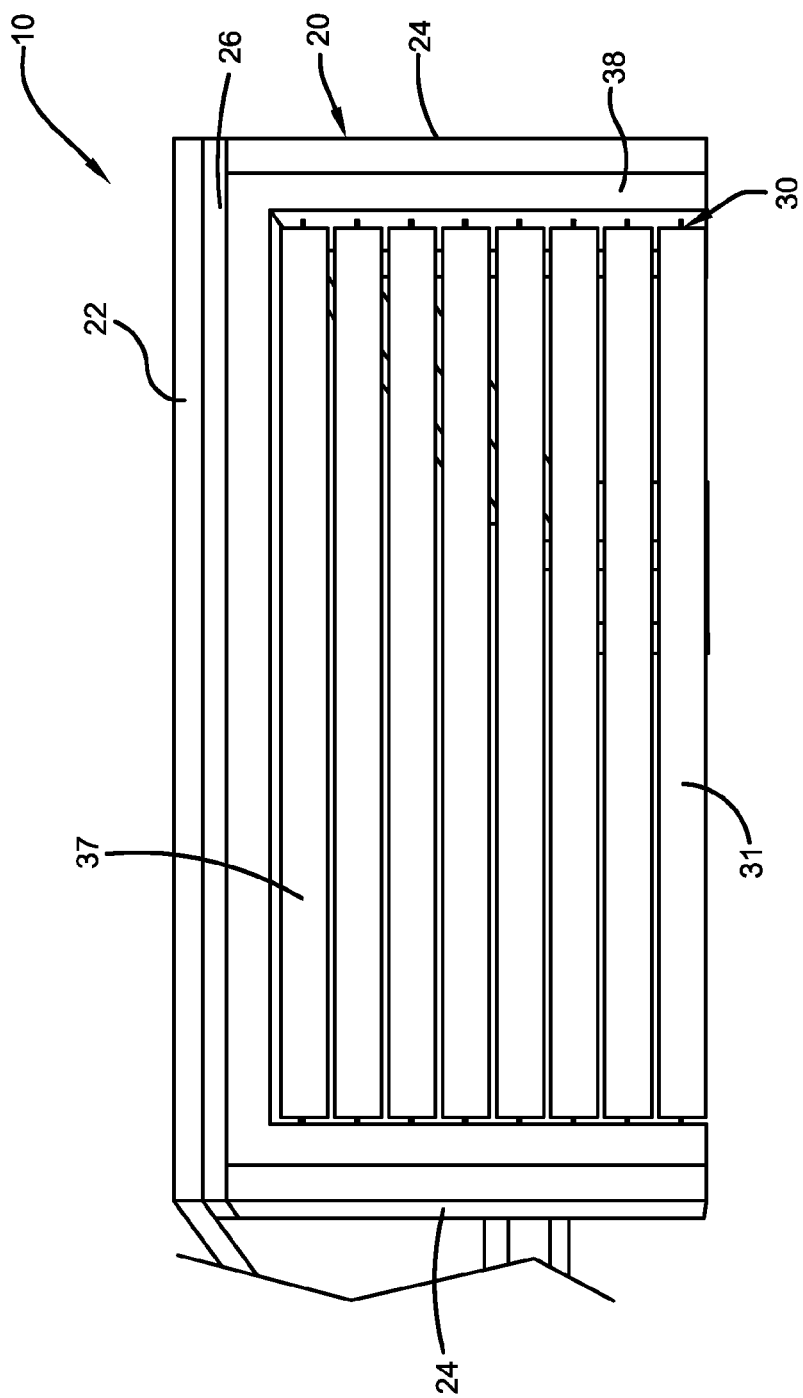
FIG. 12 is a perspective view of another embodiment of a solar panel assembly wherein the barrier assembly includes a multi-blade damper system.

In one or more embodiments, as shown in FIG. 12, barrier 31 is in the form of a louver-type fire damper system, which may also be referred to as a louver damper system or a multi-blade damper system. In particular embodiments, the louver system includes a single blade 37. In one or more embodiments, the louver damper system includes a plurality of pivotable flaps 37, which may also be referred to as blades 37, pivotally secured in a frame 38; for example they may be connected to the frame through a rod or shaft. In one or more embodiments, these blades 37 may be oriented generally parallel to one another in a horizontal position, which is generally parallel to the roof surface. The flaps are rotateably movable between an open position and a closed position. In the open position, the flaps are positioned so that their faces or planar surfaces are oriented parallel to the direction of airflow through the frame, and in the closed position, the faces are oriented perpendicular to the direction of airflow to inhibit airflow through the frame. In certain embodiments, the flaps may overlap one another when in the closed position. The flaps may be linked together by an operating rod that is biased in an open position, and is connected to a connector that actuates the rod upon detecting elevated temperatures. Movement of the rod causes pivoting of the flaps. U.S. Pat. No. 4,100,931 discloses an exemplary louver-type fire damper, and is incorporated herein by reference.

Figure 13:
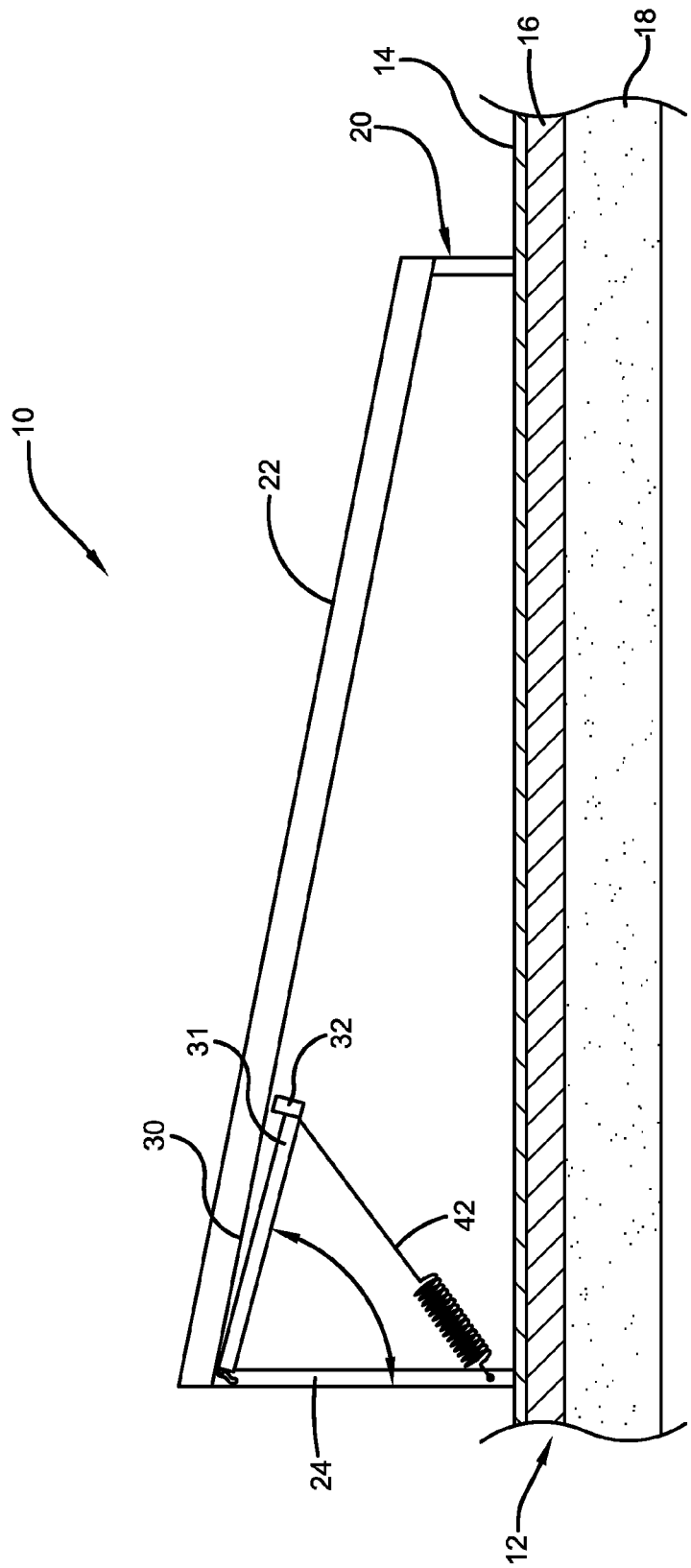
FIG. 13 is a cross-sectional view of another embodiment of a solar panel assembly where the barrier assembly includes a swinging door.
Figure 14:
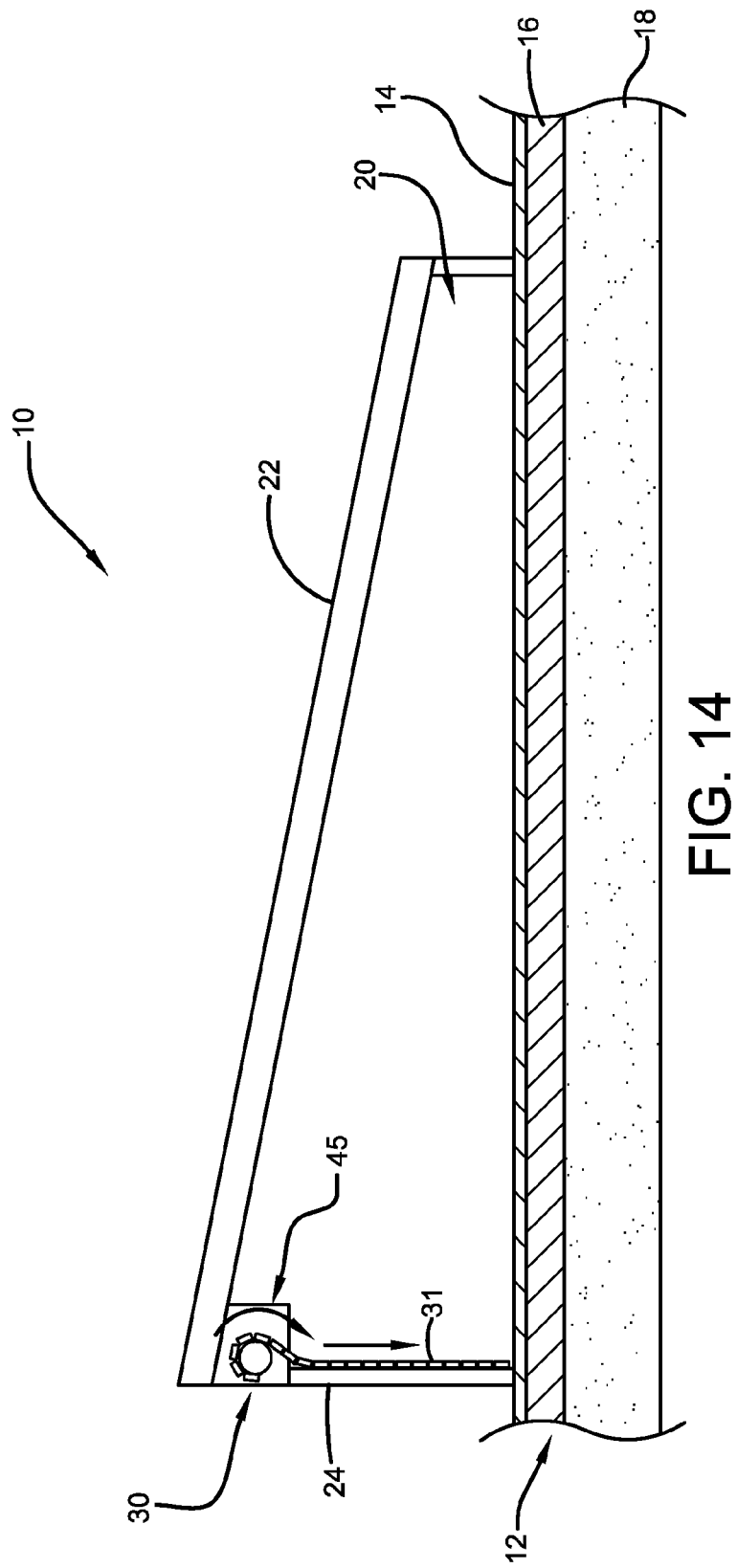
FIG. 14 is a cross-sectional view of another embodiment of a solar panel assembly where the barrier assembly includes a curtain door system.

In one or more embodiments, barrier 31 includes a swinging door 31 as generally shown in FIG. 13. Door 31 is movable between an open position in which it is generally parallel to a direction of airflow through the opening, and a closed position in which it is generally perpendicular to the direction of airflow and thereby blocks airflow through or under the solar panel. In one or more embodiments, door 31 rotates between an open and closed position around a hinge that that may be located at or between legs 24 of rack assembly 20. A biasing member may be provided to bias the door toward the closed position, and a temperature sensitive latch may hold the door in the open position unless temperatures pass an upper limit threshold. In one or more embodiments, as shown in FIG. 13, door 31 may be attached to a spring 42 that applies force toward the closed position. Element 32 (e.g., a fusible link) may hold door 31 in the open position until released. This may be accomplished by element 32 connecting or securing door 31 to, for example, support structure 20. At the time of release, the force applied by spring 42 will force door 31 to the closed position. As described in greater detail below, the skilled person will be able to configure the door and biasing element (e.g. spring) in a number of configurations once the present invention is understood. In one or more embodiments, door 31 may include an insulating material to control heat transfer through the barrier for a predetermined period of time. In certain embodiments, assembly 30 may include a housing that defines an opening in which door 31 is rotationally mounted. In particular embodiments, when in the closed position, door 31 forms a substantially gas tight seal with the housing (not shown). Useful swinging doors are described in U.S. Patent Application Publication 2008/0264405, which is incorporated herein by reference. In one or more embodiments, as shown in FIG. 13, door 31 is hinged to solar panel assembly 20 within a curved slot 47 that, upon rotation of the door to the closed position, curved slot 47 in combination with the weight of the door causes a downward force that locks the door in the closed position and can maintain force downward toward the surface of the roof.

In one or more embodiments, as shown in FIGS. 3-8 and FIG. 14, barrier 31 includes a curtain-type fire damper 31, which may also be referred to as a curtain fire damper 51, a curtain door 31, or a paneled door 31. The curtain fire damper 31 may include a plurality of blades pivotally coupled to one another and secured within a frame or track (e.g. track 35 shown in FIG. 8) that defines an opening. In the open position, the curtain damper may be housed (e.g., by being rolled) within a housing 45, which may also be referred to as a canister 45. A heat sensitive connector, or link assembly, retains the blades in an open position (e.g. rolled within housing 45) during normal operation to allow airflow through the frame (i.e. below or underneath the solar panels). When a fire event is detected (e.g. the presence of heat melts an element of a fusible link), the connector is released to allow the blades to extend across (e.g. drop down) the opening and inhibit further airflow through the opening. In one or more embodiments, curtain door 31 can be attached to or otherwise connect to one or more elements that apply force to door 31 and thereby favor the closed position and/or expedite movement toward the closed position. In certain embodiments, the lower portion of the door is weighted to favor the closed position. In other embodiments, door 31 may be attached to a spring (e.g. a tape spring). U.S. Pat. Nos. 4,763,711 and 3,467,163 disclose exemplary curtain-type fire dampers and are incorporated herein by reference.

Figure 15:
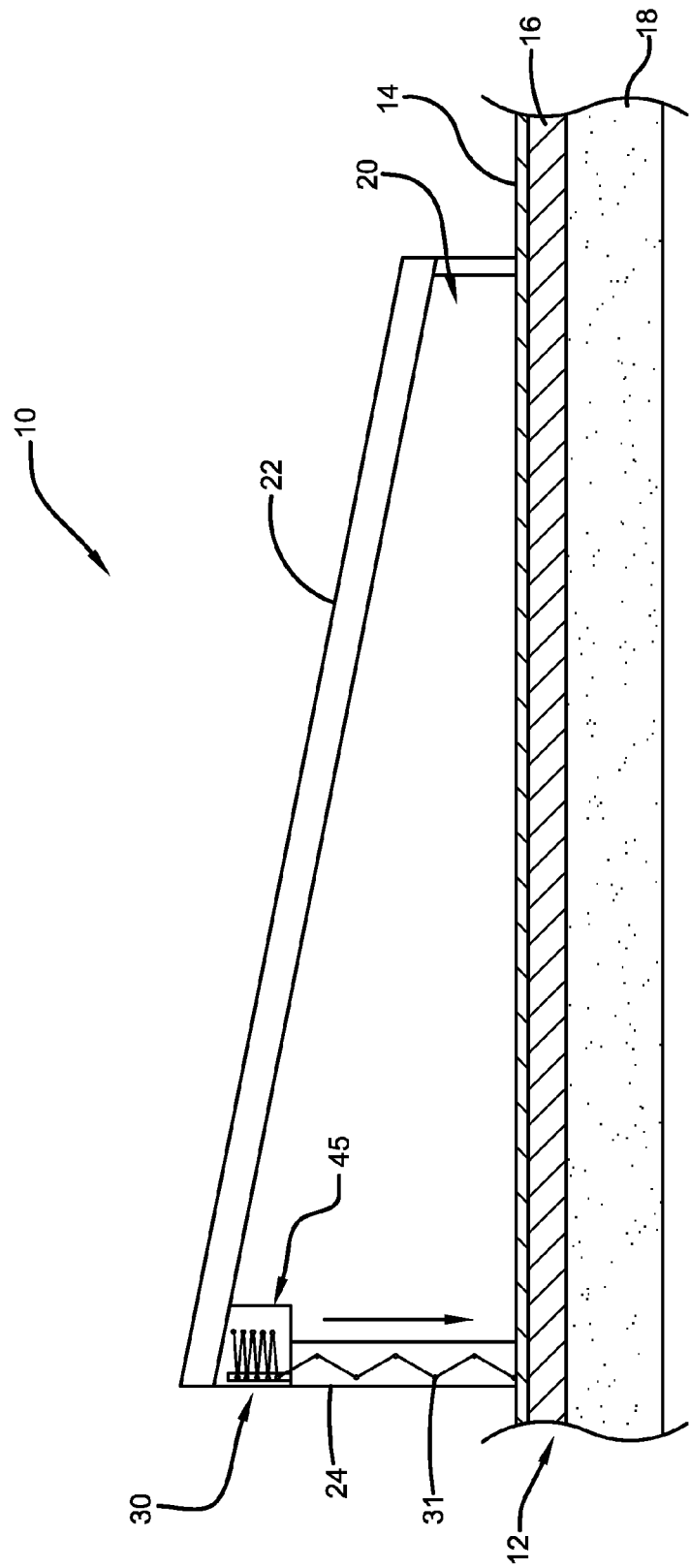
FIG. 15 is a cross-sectional view of another embodiment of a solar panel assembly where the barrier assembly includes an accordion door system.

In one or more embodiments, as shown in FIG. 15, barrier 31 includes an accordion-type fire damper 31, which may also be referred to as accordion door 31 or accordion fire damper 31. In one or more embodiments, accordion door 31 may include a plurality of blades pivotally coupled to one another in a manner that allows the blades to be stacked or folded in an alternating pattern as shown in FIG. 15. As with the previous embodiments, door 31 may be housed within a housing 45, which may also be referred to as a canister 45. A heat sensitive connector, or link assembly, retains the blades in an open position (e.g. folded within housing 45) during normal operation to allow airflow through the frame (i.e. below or underneath the solar panels). When a fire event is detected (e.g. the presence of heat melts an element of a fusible link), the connector is released to allow the blades to extend across (e.g. drop down) the opening and inhibit further airflow through the opening. In one or more embodiments, accordion door 31 can be attached to otherwise connect to one or more elements that apply force to door 31 and thereby favor the closed position and/or expedite movement toward the closed position. In certain embodiments, the lower portion of the door is weighted to favor the closed position. In other embodiments, door 31 may be attached to a spring (e.g. a tape spring).

As generally shown in FIG. 8, barrier assembly may include a frame 34 that may include, for example, housing 33, which may also be referred to as canister 33, that may be attached horizontally to solar panel 22. Housing 33 may form an upper or top portion of the frame. Attached to or proximate to housing are one or more tracks 35, which may also be referred to as guides or guide rails 35. Tracks 35 are mounted in the vertical position and may form the sides of the frame. Tracks 35 may be adapted to receive at least a portion of door 31 and thereby guide door 31 as it moves between the open and closed position. While barrier assembly need not include a frame since, for example, door 31 can be directly attached to the solar panel assembly (e.g. attached directly to legs 24 or panel 22), the frame provides advantages in that, for example, barrier assembly can be provided as an integral unit itself for shipment with or separate from solar panel assembly. As a result, barrier assembly can sold as an after-market accessory that that be applied to solar panel assembly before or after installation of solar panel assembly to the roof surface. In the alternative, by providing a barrier assembly with a frame (e.g. housing or top and two or more sides or guides), barrier assembly can form at least a portion of rack system 20 that supports panels 22.

In one or more embodiments, and as generally discussed above, barrier assembly 30 may include a connector 32 to maintain movable barrier 31 in an open position. In one or more embodiments, connector 32 may include a latch or lock mechanism inhibiting movable barrier 31 from movement and, optionally, an actuator device adapted to release the latch or lock mechanism to allow barrier 31 to move upon detection of conditions indicative of a fire. In certain embodiments, connector 32 may be interconnected with a security or fire alarm system of a building, and may be actuated upon triggering of that system. In one or more embodiments, connector 32 may be actuated by temperatures exceeding a threshold temperature to release connector 32 and allow movable barrier 31 to move from the open position to the closed position. In one or more embodiments, connector 32 may be actuated by detection of smoke in or around the structure.

In one or more embodiments, the connector 32 may include a thermocouple which, upon detection of a temperature exceeding a threshold temperature, sends an electrical signal to release the connector. In certain embodiments, the thermocouple may be connected by the appropriate circuitry to a solenoid or other electromechanical actuating device to release the connector and/or move the barrier 31 into the closed position. U.S. Patent Application Publication No. 2007/0017738 discloses a fire damper utilizing connector including a thermocouple and is incorporated herein by reference.

In other embodiments, the connector 32 is or may include a fusible link. Fusible links are generally known to those skilled in the art. In one or more embodiments, the fusible link extends between movable barrier 31 and a support frame or housing of barrier assembly 30. In one or more embodiments, the fusible link may be a mechanical fusible link including two strips of metal soldered together with a fusible alloy that is designed to melt at a specific temperature. When the fusible link is subjected to excess temperatures, the fusible alloy melts, thereby separating the two strips of metal and allowing movable barrier 31 to close. U.S. Patent Application Publication 2008/0141486 discloses an exemplary connector with a fusible link, and is incorporated herein by reference.

In one or more embodiments, and as generally discussed above, barrier assembly 30 may include a spring or other biasing mechanism to bias movable barrier 31 toward the closed position. In these embodiments, movable barrier 31 will quickly move to the closed position when connector 32 is released or triggered upon detection of conditions indicative of a fire. For example, as shown in FIG. 7, barrier assembly 30 may include a spring tape within guide 35 that applies a downward pulling force on door 31. The selection of any particular biasing mechanism or spring can be selected by the skilled person once the teachings of the present invention are understood. For example, the skilled person can select a variety of spring mechanisms such as coiled springs, tape springs, tension springs (as shown in FIG. 13), torsion springs, compression springs, and clock springs. In one or more embodiments, barrier assemblies can be devoid of additional elements used to place additional force on the closing of door 31 and may simply rely upon gravity to move movable barrier 31 to the closed position when connector 32 is released upon detection of conditions indicative of a fire.

Roofing systems are often designed to achieve certain fire ratings or certifications, both to comply with building codes as well as for market appeal. For example, many roofing membranes and systems are designed to achieve a class A fire rating from Underwriter Laboratories (UL), which regulates and certifies products with fire ratings. However, when conventional solar panel assemblies are installed over some roofing systems, it is possible that the decrease in fire resistance of the roofing system will result in a failure to achieve the desired fire rating (e.g. Class A). This decrease in fire performance results from the air flow beneath the solar panels during a fire, which can accelerate the spread of the fire across the roof. In one or more embodiments, a roofing assembly including the solar panel assembly of the present invention may perform well enough during testing to achieve a fire rating of Class A according to Underwriter Laboratory standards.

The inclusion of a barrier assembly 30 having a barrier 31 that is movable between an open position and a closed position in solar panel assembly 10 provides improved fire resistance of the roofing system without sacrificing the efficiency of the solar panels. When the barrier assemblies 30 are in the open position, airflow beneath the solar panels is permitted, thereby cooling the panels to increase the efficiency. Upon detecting excess temperatures generated by a fire upon the roof, movable barriers 31 move from the open position to the closed position, thereby inhibiting further airflow beneath solar panels 22. Thus, the acceleration and/or amplification of the fire, as sometimes experienced in prior art roofing assemblies that include solar panel assemblies, may be reduced or, in certain instances, eliminated.

Figure 16:
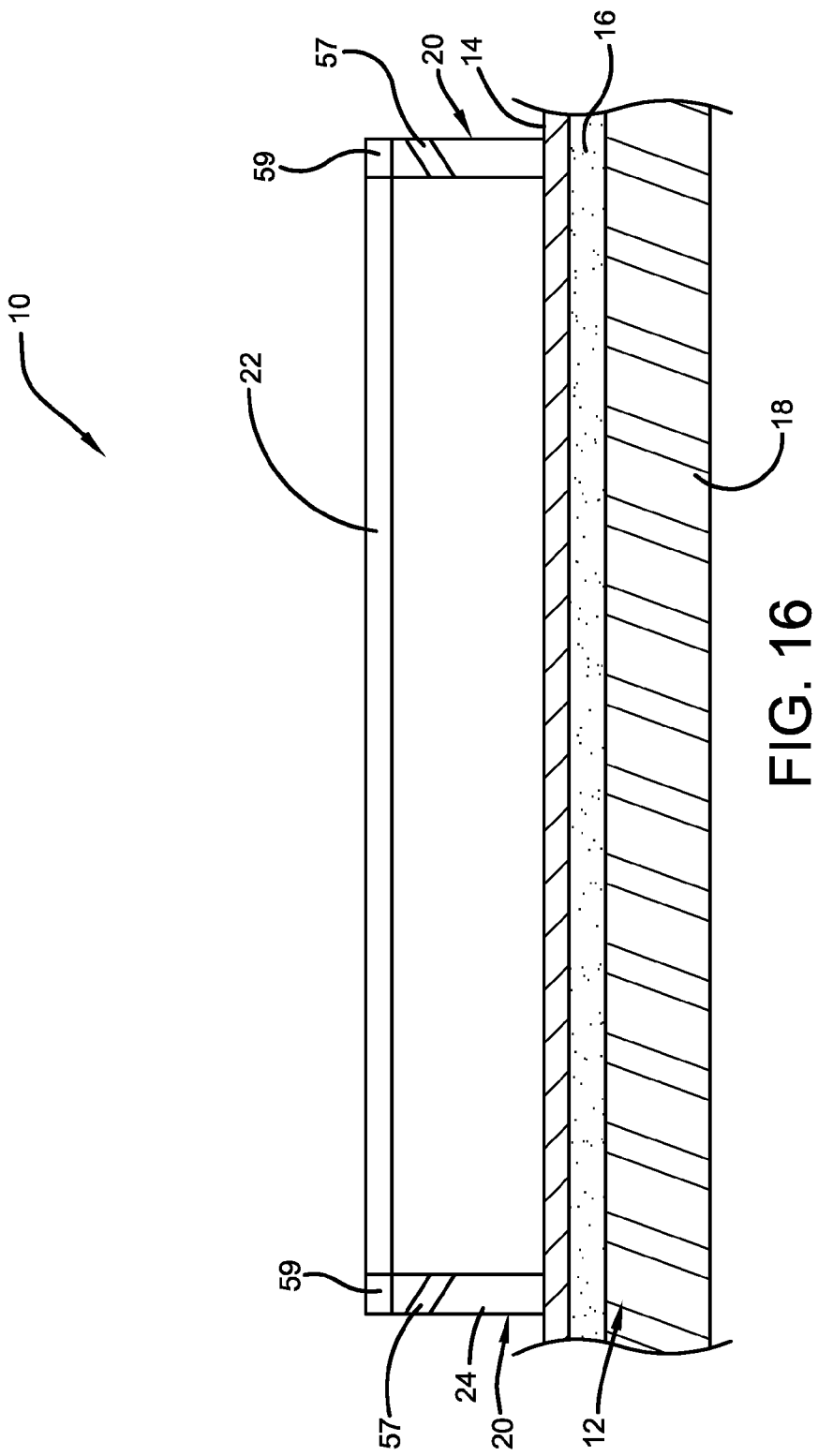
FIG. 16 is a side view of a solar panel assembly having elements within the legs and/or fusible links within the rack that allow the rack system to collapse when exposed to heat caused by fire.

It is also contemplated that airflow beneath the solar panels may be inhibited during a fire without use of barrier assemblies 30 discussed above. In one or more embodiments, rack 20 of the solar panel assembly may itself be adapted to fail or release the solar panel upon exposure to conditions indicative of a fire. In certain embodiments, rack 20 may be formed from or include a material with a relatively low melting point. In these embodiments, upon exposure to an elevated temperature, rack 20 may fail, causing solar panel 22 to drop so that it is resting upon roofing membrane 14 or other roofing surface, and thereby eliminating the gap between solar panel 22 and roofing membrane 14 that may act to accelerate the fire. In a particular embodiment, only portions of rack 20 may be formed from the material having a low melting point. For example, and as shown in FIG. 16, legs 24 include meltable portions 57 that are selected to melt upon exposure to heat that is indicative of fire. These meltable portions may be designed at a particular geometry, e.g., at an angle, that facilitates collapse of solar panel 22. In other embodiments, solar panel 22 may be connected to rack 20 by fusible links or other temperature sensitive connecting mechanisms. For example, and as also shown in FIG. 16, solar panel 22 is attached to legs 24 via a fusible link 59. The skilled person will readily understand that solar panel 22 could also be attached to other elements of rack 20 via a fusible link and still achieve a similar goal. Upon exposure to elevated temperatures, such as those generated during a fire, the temperature sensitive connecting mechanisms may release the solar panel so that it falls to rest on roofing membrane 14 or other roof surface. In this way, airflow beneath solar panels 22 is provided during normal operation of the solar panel assembly, but is inhibited upon detection of conditions indicative of a fire.

Various modifications and alterations that do not depart from the scope and spirit of this invention will become apparent to those skilled in the art. This invention is not to be unduly limited to the illustrative embodiments set forth herein.

The invention claimed is:

1. A roofing assembly comprising:
    (a) a roof substrate;
    (b) a moisture-impervious membrane above said roof substrate;
    (c) a four-sided support rack positioned on said moisture-impervious membrane, the support rack having a front side, a back side, a left side and a right side, where each of the front side, the back side, the left side, and the right side include an opening that allows air flow through said opening between said solar panel and said moisture-impervious membrane;
    (d) at least one solar panel positioned above said four-sided support rack; and
    (e) a barrier assembly positioned in the openings at each of the front side, the back side, the left side and the right side, wherein said barrier assemblies are each movable between an open position and a closed position and wherein each of the barrier assemblies include a connector to maintain the respective barrier in the open position, each barrier assembly being adapted to inhibit airflow through the respective openings when in the closed position.

2. The solar panel assembly of claim 1 where said support rack includes a plurality of legs extending vertically between said surface and said solar panel.

3. The solar panel assembly of claim 1, where said barrier assemblies extends laterally between two of said legs.

4. The solar panel assembly of claim 1, where said barrier assemblies are a louver-type fire damper.

5. The solar panel assembly of claim 1, where said barrier assemblies are a curtain-type fire damper.

6. The solar panel assembly of claim 1, where said barrier assemblies are a swinging door-type fire damper.

7. The solar panel assembly of claim 1, where said barrier assemblies are an accordion-type fire damper.

8. The solar panel assembly of claim 1, where at least one of said connectors includes a fusible link that releases the barrier when subjected to increased temperatures, allowing the barrier to move to the closed position.

9. The solar panel assembly of claim 8, where said fusible link is a mechanical fusible link.

10. The solar panel assembly of claim 1, where at least one of the said connectors includes a thermocouple.

11. A solar panel assembly comprising:
    a solar panel; and
    a support rack adapted to support said solar panel at a height over a roof deck; where the support rack includes one or more elements that are designed to fail upon exposure to heat generated by fire and thereby allow the solar panel to fall to the roof deck when exposed to fire.

12. The solar panel assembly of claim 11, where said support rack includes a plurality of legs extending vertically away from the solar panel, and where said plurality of legs include a meltable portion.

* * * * *